(12) United States Patent
Kitamura et al.

(10) Patent No.: US 6,707,131 B2
(45) Date of Patent: Mar. 16, 2004

(54) SEMICONDUCTOR DEVICE AND MANUFACTURING METHOD FOR THE SAME

(75) Inventors: Shoji Kitamura, Nagano (JP); Toshiyuki Matsui, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/060,417

(22) Filed: Jan. 30, 2002

(65) Prior Publication Data

US 2002/0158246 A1 Oct. 31, 2002

(30) Foreign Application Priority Data

Jan. 31, 2001 (JP) .......................... 2001-023985

(51) Int. Cl.⁷ ............................................ H01L 29/167
(52) U.S. Cl. ..................................................... 257/610
(58) Field of Search ................................ 257/376, 610, 257/611, 612; 438/543, 917

(56) References Cited

U.S. PATENT DOCUMENTS

| | | | | |
|---|---|---|---|---|
| 4,609,414 A | * | 9/1986 | Bouard | 438/342 |
| 5,227,315 A | * | 7/1993 | Frisina et al. | 438/139 |
| 5,747,371 A | * | 5/1998 | Robb et al. | 438/273 |
| 6,093,955 A | * | 7/2000 | Garnham et al. | 257/610 |
| 6,358,825 B1 | * | 3/2002 | Hao et al. | 438/543 |

FOREIGN PATENT DOCUMENTS

| | | | | |
|---|---|---|---|---|
| JP | 02135737 A | * | 5/1990 | H01L/21/322 |
| JP | 08046221 | | 2/1996 | |
| JP | 09205217 | | 8/1997 | |

OTHER PUBLICATIONS

Properties of Platinum–associated deep levels in silicon, by Y. K. Kwon, T. Ishikawa, and H. Kuwano, 61 J. Appl. Phys. 1055–1058 (1987)(provided in English).

* cited by examiner

Primary Examiner—Erik J. Kielin
Assistant Examiner—Jennifer M Dolan
(74) Attorney, Agent, or Firm—Darby & Darby

(57) ABSTRACT

An N-type semiconductor layer with a low impurity concentration is grown by epitaxial growth on top of an N-type semiconductor substrate. An oxide film, with a desired pattern, is formed on the surface of the semiconductor layer. Using the oxide film as a mask, an active region edge and a guard ring region are formed by ion injection. After formation, the portion that forms the active region is exposed, and a paste containing platinum is coated onto the back surface of semiconductor substrate. The platinum is heat diffused into the substrate. Through this process, a region near the surface of the active region of semiconductor layer reverses to a P-type, and a shallow reverse region is formed, thereby producing a fast diode with adequate soft recovery characteristics.

9 Claims, 17 Drawing Sheets

SEMICONDUCTOR DEVICE AND MANUFACTURING METHOD FOR THE SAME

BACKGROUND TO THE PRESENT INVENTION

1. Field of the Invention

The present invention relates to a semiconductor device and a manufacturing method for the same. In particular, the present invention relates to a semiconductor device that is used as a rectifying device and employs a pn junction. The present invention also relates to a manufacturing method for the same.

2. Description of the Related Art

In general, semiconductor devices used in high frequency switching, employ high speed recovery diodes. These diodes have a pn junction between a P type semiconductor region and an N type semiconductor region. The lifetime of the carrier is shortened by the diffusion of a heavy metal, such as platinum, known as a 'lifetime killer.'

Referring now to FIG. 21, a longitudinal cross-section of a high speed recovery diode includes an N type semiconductor substrate 11. An N type semiconductor layer 12 has a lower carrier density than semiconductor substrate 11.

Semiconductor layer 12 is formed on top of semiconductor substrate 11 by epitaxial growth. An Active region 13 and a guard ring region 14 are formed by patterning an oxide film 15, layered on top of semiconductor layer 12, and using oxide film 15 as a mask, P-type impurities are ion injected. After the ion injection, the surface of semiconductor layer 12 is again covered by oxide film 15 through heat treatment. A section of oxide film 15 is removed in order to expose active region 13. After heat diffusion of platinum, a front electrode 16 is formed on top of active region 13. A back electrode 17 is formed on the back surface of semiconductor substrate 11.

The above-described diode is sometimes used in power factor improvement circuits (PFC). In general, diodes used for this purpose must have soft recovery characteristics in which the reverse recovery current is small and the current attenuation factor after the peak of the reverse current during reverse recovery is small.

When the reverse recovery current is large, this leads to an undesirable increase in the turn on loss for a MOS transistor frequently used as a switching element on the power factor improvement circuit (PFC) and also leads to an undesirable rise in temperature of the element.

If the attrition rate is large, a large voltage noise is generated and added onto the power voltage, and by having this voltage applied to the diode and MOS transistor, the element can be destroyed and errors in the circuit may result.

With the related art pn junction diode shown, there is an attempt to reduce the reverse recovery current by shortening the carrier lifetime by controlling the platinum diffusion conditions. However, there is a 'tradeoff' between the forward voltage of the diode and the reverse recovery current, and the forward voltage of the diode increases. Furthermore, controlling the platinum diffusion conditions alone does not solely reduce the attrition rate of the reverse current during reverse recovery. As a result, an adequate soft recovery is not achieved.

In addition to platinum concentration, the thickness of semiconductor layer 12 and the anode carrier concentration are optimizable, but when the thickness of semiconductor layer 12 increases, there is a corresponding increase in the forward voltage, and the tradeoff is worsened.

With pn junction diodes, in which platinum is diffused, as the 'lifetime killer' platinum piles up near the surface of the diode in a region and at a depth of several micrometers. Therefore, the beneficial effect of the platinum is not adequate near pn junctions that are deeper than several micrometers. As a result, the improvement in the 'tradeoff' is inadequate, and there is little if any improvement in the soft recovery characteristics.

To provide an adequate effect of platinum near the pn junction, the injection amount of platinum may be increased. Unfortunately, if the injection amount is increased, not only does the N-type semiconductor layer become high resistance, but defects are increased due to the high platinum concentration in the P-type active region, resulting in at least an increase in leakage current.

OBJECTS AND SUMMARY OF THE INVENTION

It is an object of the present invention to provide a semiconductor device and manufacturing method for the same which overcomes the drawbacks of the related art noted above.

It is another object of the present invention to provide a semiconductor device and a manufacturing method for the same which provides a diode with high speed as well as soft recovery characteristics.

The present invention relates to a semiconductor device and a manufacturing method for the same wherein a N-type semiconductor layer with a low impurity concentration is grown by epitaxial growth on top of a N-type semiconductor substrate. An oxide film with a desired pattern is formed on the surface of the semiconductor layer. Using the oxide film as a mask, an active region edge and a guard ring region are formed by ion injection. After formation, the portion that forms the active region is exposed, and a paste containing platinum is coated onto the back surface of semiconductor substrate, and heat diffusion of platinum occurs. Through this process, a region near the surface of the active region of semiconductor layer reverses to a P-type, and a reverse region is shallowly formed producing a fast diode with adequate soft recovery characteristics.

According to an embodiment of the present invention, there is provided a semiconductor device, comprising: a semiconductor region being a first conductive type, a reverse region being a second conductive type, the reverse region selected in a first surface of the semiconductor region, the reverse region being formed by platinum doping at a higher concentration near the first surface of the semiconductor region than in an interior portion of the semiconductor region, and the semiconductor region and the reverse region forming a pn junction.

According to another embodiment of the present invention, there is provided a semiconductor device, wherein: at least a first portion of the first surface of the semiconductor region being covered by at least an oxide film, and the reverse region being formed in a first region corresponding to an open window of the oxide film.

According to another embodiment of the present invention, there is provided a semiconductor device, further comprising: at least a first electrode electrically contacting the reverse region, at least a second electrode electrically contacting the semiconductor region, at least one impurity diffusion region being the second conductive type surrounding the reverse region in at least a first zone, and the impurity diffusion region joining the semiconductor region at a second position deeper than a first position of the pn junction.

According to another embodiment of the present invention, there is provided a semiconductor device, further comprising: a plurality of impurity diffusion regions, and an innermost impurity diffusion region, of the plurality of impurity diffusion regions, connecting to the reverse region and the first electrode.

According to another embodiment of the present invention, there is provided a semiconductor device, further comprising: at least a first electrode electrically contacting the reverse region, at least a second electrode electrically contacting the semiconductor region, and a second reverse region surrounding the reverse region and being reversed to the second conductive type by platinum doping at a higher concentration near the first surface of the semiconductor region than the interior.

According to another embodiment of the present invention, there is provided a semiconductor device, wherein: the first electrode additionally electrically contacting the semiconductor region.

According to another embodiment of the present invention, there is provided a semiconductor device, wherein: the first electrode additionally electrically contacting the semiconductor region.

According to another embodiment of the present invention, there is provided a semiconductor device, wherein: the first electrode additionally electrically contacting the semiconductor region.

According to another embodiment of the present invention, there is provided a semiconductor device, wherein: the semiconductor region being a silicon semiconductor.

According to another embodiment of the present invention there is provided a manufacturing method for a semiconductor device, comprising the steps of: covering at least a first portion on a first main surface of a semiconductor region with an oxide film, and the semiconductor region being a first conductive type, forming a reverse region of a second conductive type in an exposed portion selected in the first main surface of the semiconductor region by doping with platinum, and the doping with platinum forming a higher concentration of platinum proximal the first main surface than an interior portion of the semiconductor region, forming a first electrode on at least the reverse region, the first electrode being in electrical connection with at least the reverse region, and forming a second electrode on at least a second main surface of the semiconductor region, the second electrode being in electrical connection with at least the second main surface.

According to another embodiment of the present invention there is provided a manufacturing method for a semiconductor, wherein: the step of forming a reverse region by doping with platinum includes a step of heat diffusing platinum from one of the exposed portion of the first main surface and the second main surface.

According to another embodiment of the present invention there is provided a manufacturing method for a semiconductor, wherein: the step of forming the reverse region includes a step of controlling a depth of the reverse region by selecting at least one of a time and a temperature for the step of step of heat diffusing platinum.

According to another embodiment of the present invention there is provided a manufacturing method for a semiconductor, comprising the steps of: covering at least a first portion on a first main surface of a semiconductor region with a oxide film, and the semiconductor region being a first conductive type, injecting impurity ions of a second conductive type into at least a first selected section the semiconductor region using the oxide film covering the first portion as a mask, heat treating the semiconductor region receiving the impurity ions, and forming at least one impurity diffusion region of the second conductive type and covering the first main surface with the oxide film, removing the oxide film from the first surface to form an exposed portion surrounding the at least one impurity diffusion region, forming a reverse region of the second conductive type in a region surrounded by the impurity diffusion region selected in the first main surface of the semiconductor region by doping with platinum, and the doping with platinum forming a higher platinum concentration nearer the first main surface than an interior portion of the semiconductor region, forming a first electrode on at least the reverse region, the first electrode being in electrical connection with at least the reverse region, and forming a second electrode on at least a second main surface of the semiconductor region, the second electrode being in electrical connection with at least the second main surface.

According to another embodiment of the present invention there is provided a manufacturing method for a semiconductor, wherein: the step of forming a reverse region by doping with platinum includes a step of heat diffusing platinum from one of the exposed portion of the first main surface and the second main surface of the semiconductor region.

According to another embodiment of the present invention there is provided a manufacturing method for a semiconductor, wherein: the step of removing the oxide film includes a step of exposing an innermost impurity diffusion region of the impurity diffusion region, and the step of forming the first electrode includes a step of forming the first electrode in contact with the innermost impurity diffusion region.

According to another embodiment of the present invention there is provided a manufacturing method for a semiconductor, wherein: the step of forming the reverse region includes a step of controlling a depth of the reverse region by selecting at least one of a time and a temperature for the step of step of heat diffusing platinum.

To achieve the above objectives, the present invention, dopes a semiconductor region of a first conductivity type with platinum, a portion of the semiconductor region near the surface that is not covered by a oxide film is reversed to a second conductivity type, and a pn junction is formed by this reverse region of the second conductivity type and the semiconductor region of the first conductivity type. The depth of the pn junction is adjusted by controlling the temperature and time for the heat diffusion of platinum.

According to this invention, the pn junction is formed by the reverse region of the second conductivity type formed by doping with platinum and the semiconductor region of the first conductivity type. Therefore, the pn junction is shallower than that of the related art, and the position of the pn junction coincides with a position where there is effective action of platinum.

The above, and other objects, features, and advantages of the present invention will become apparent from the following description read in conjunction with the accompanying drawings, in which like reference numerals designate the same elements.

DESCRIPTION OF THE PREFERRED EMBODIMENTS

During the description below a first conductivity type is an N type, and a second conductivity type is a P type in a semiconductor made of a suitable semiconductor material, for example silicon.

First Embodiment

Figure 1:
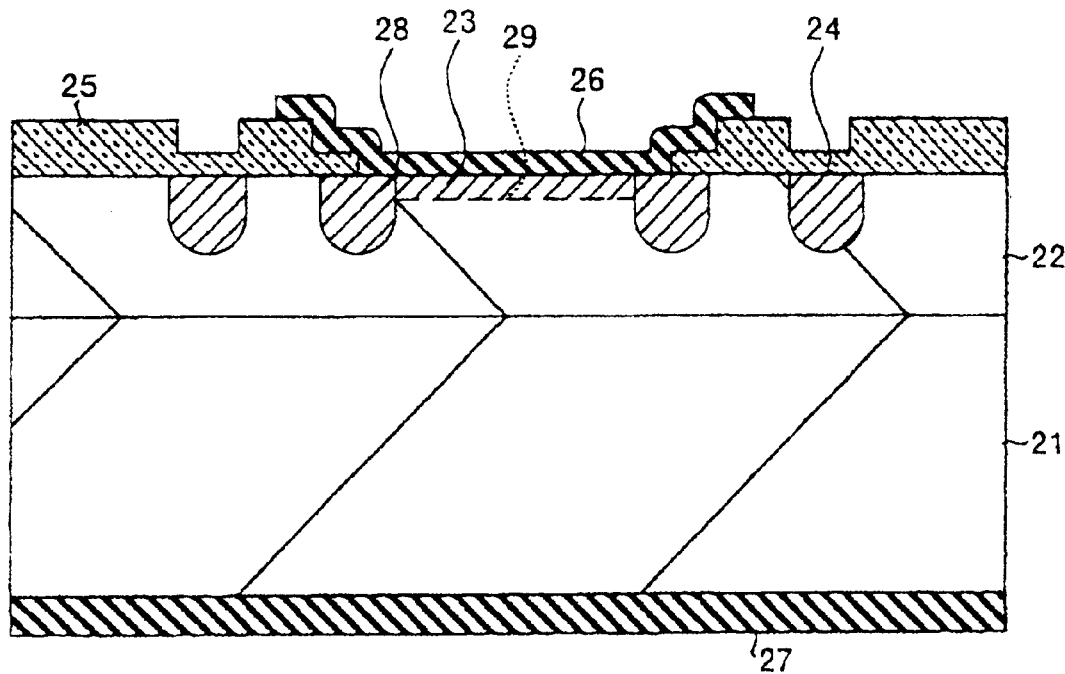
FIG. 1 is a longitudinal cross-section diagram of a semiconductor device according to a first embodiment of the present invention.

Referring now to FIG. 1, a semiconductor device has a semiconductor substrate 21 of a N-type of an As (arsenic) doping, a semiconductor layer 22 of a N-type of a P (phosphorus) doping. A reverse region 23 is a P-type, and a guard ring region 24 is a P-type. An oxide film 25 and a front electrode 26 are on top of a semiconductor layer 22. A back electrode 27 is opposite front electrode 26 and an active region edge 28.

As an example, the thickness of semiconductor substrate 21 is 300 micrometers, and its impurity concentration is $2 \times 10^{19}$ cm$^{-3}$. As an additional example, the thickness of semiconductor layer 22 is 60 micrometers, and its impurity concentration is $2 \times 10^{14}$ cm$^{-3}$.

A portion of a surface of semiconductor layer 22 is covered by oxide film 25. Reverse region 23 is formed in a shallow region below an area not covered by oxide film 25. The junction depth (xj: several micrometers) of reverse region 23, in other words the depth of the pn junction, is for example several micrometers. Reverse region 23 is created by having N type semiconductor layer 22 in part reversed to a P type due to the high concentration of platinum that piles up in the region near the surface of semiconductor layer 22.

The boundary of the region where the conductivity type reverses due to the diffusion of platinum is shown by a dashed line (same as in the other Figs.). The boundary indicated by this dashed line corresponds to a pn junction 29 of reverse region 23 and semiconductor layer 22. The depth of pn junction 29 is changeable as a result of heat diffusion conditions of platinum and subsequent heat treatment conditions. In other words, by controlling the heat diffusion conditions of platinum and the subsequent heat treatment conditions, the depth of pn junction 29 may be adjusted.

Active region edge 28 is formed in a region on the surface side of semiconductor layer 22 and surrounds reverse region 23. Active region edge 28 is connected to reverse region 23, and together with reverse region 23, constructs the active region.

The junction depth xj of active region edge 28 is approximately 10 micrometers and is deeper than reverse region 23. In order to provide a soft recovery, it is preferable to have a shallow junction depth for the active region.

In general however, when the active region is thin, voltage resistance failure readily occurs due to an increased electric field at the edges. In the present embodiment, by having active region edge 28 provided at the edge of the active region, an adequate voltage resistance is maintained even when the junction depth of the active region is shallower than in the related art. This is a beneficial improvement.

Guard ring region 24 is formed in a region on the surface of semiconductor layer 22. Guard ring region 24, in the present embodiment, is a single ring shape that surrounds reverse region 23 and active region edge 28. Guard ring region 24 is not restricted to this shape, but may be any shape required by the design.

The junction depth of guard ring region 24 is approximately 10 micrometers. Guard ring region 24 can be double in depth or size or other wise adapt to alternative embodiments.

Front electrode 26 is formed so that it contacts reverse region 23 and active region edge 28. Back electrode 27 is formed contacting the back surface of semiconductor substrate 21.

Figure 2A:
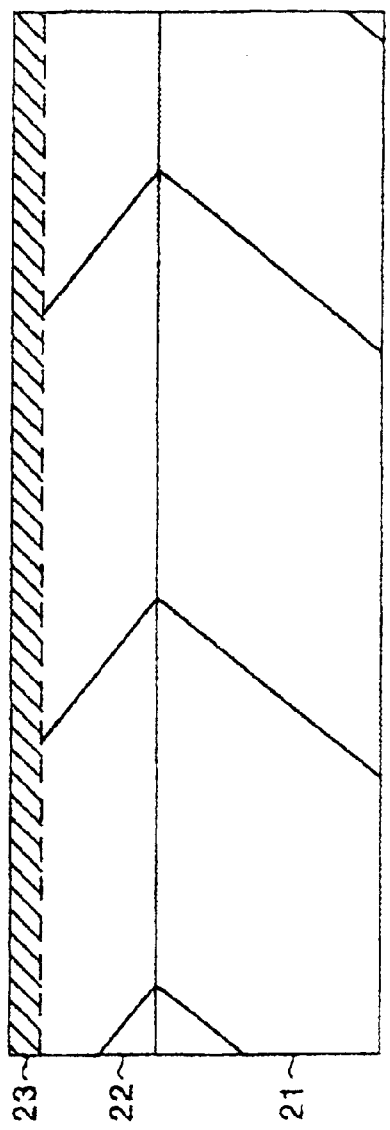
FIGS. 2(A) and 2(B) are model diagrams depicting the depth profile of platinum that has been heat diffused in the semiconductor.
Figure 2B:
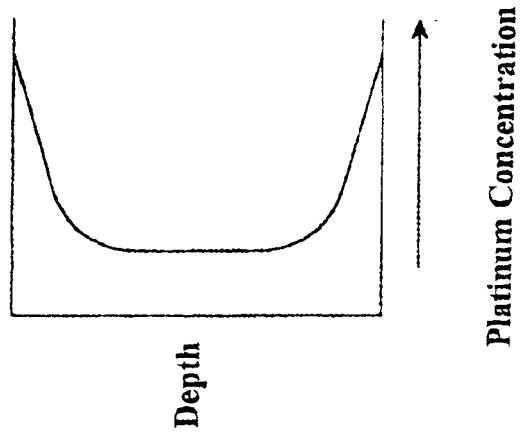

Referring now to FIGS. 2(A) and 2(B), the formation of the reverse region in an area(region) near the surface of semiconductor layer 22 results from the pile up of platinum during heat diffusion. FIGS. 2(A) and 2(B), show a model diagram for describing the depth profile of platinum which is heat diffused in a semiconductor.

As an example, semiconductor layer 22 of an N type with P doping (impurity concentration: $2\times10^{14}$ cm$^{-3}$, thickness: 60 micrometers) is grown by epitaxial growth on top of semiconductor substrate 21 of an N type with As doping (impurity concentration: $2\times10^{19}$ cm$^{-3}$, thickness: 300 micrometers).

The back surface of semiconductor substrate 21, or the front surface of semiconductor layer 22, is coated with a paste containing 1 weight % of platinum. Heat treatment is conducted for 3 hours at 920 degrees C. During heat treatment, there is a 'pile up' of platinum, and biased distribution of platinum at the back surface of semiconductor substrate 21 and the front surface of semiconductor layer 22 occurs. When result occurs, platinum acts as an acceptor, and a region several micrometers from the front surface of semiconductor layer 22 (which has a low impurity concentration) reverses to a P-type.

Figure 3:
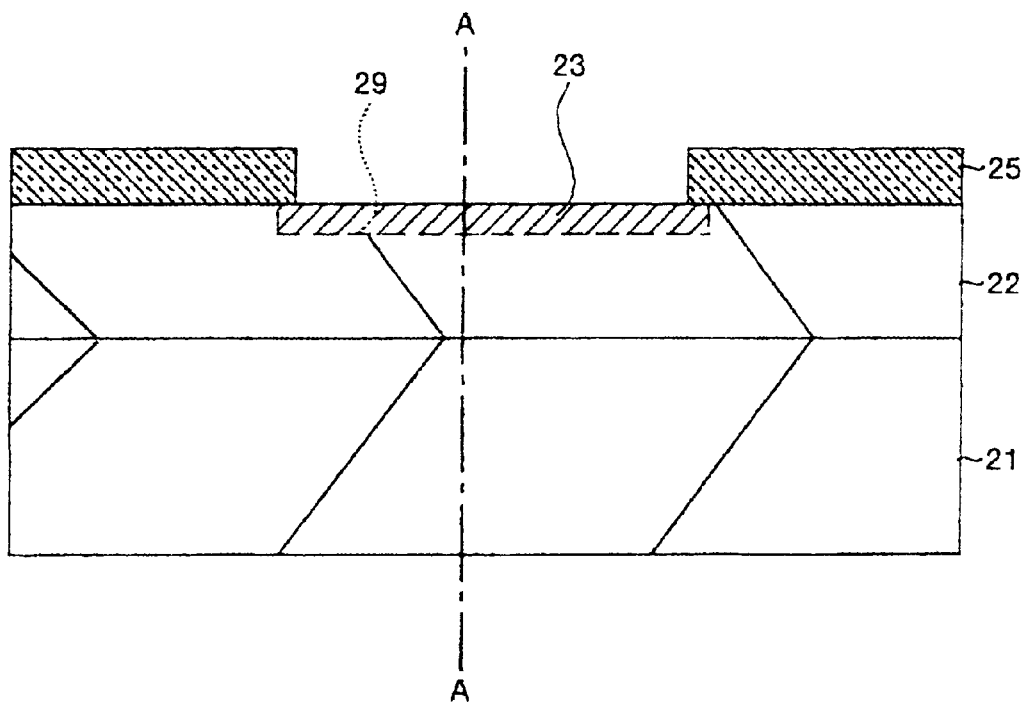
FIG. 3 is a longitudinal cross-section diagram of a semiconductor showing how a reverse region is formed in only a specified region by an oxide film.

Referring now to FIG. 3, in the region near the surface of N-type semiconductor layer 22, the region that reverses to a P type due to the 'pile up' of platinum is a region where the surface of semiconductor layer 22 is not covered by oxide film 25. In other words, oxide film 25 of a thickness 90 nm is formed on the surface of N-type semiconductor layer 22. The center part is removed by a photolithography technique, and semiconductor layer 22 is exposed. A paste containing 1 weight % of platinum is coated onto the back surface of semiconductor substrate 21 or the exposed surface of semiconductor layer 22. Heat treatment is conducted for 3 hours at 920 degrees C. There is a biased distribution of a high concentration of platinum only in the exposed region of semiconductor layer 22 not covered by oxide film 25, and this region reverses to a P-type. This result occurs because the platinum diffused near the surface of semiconductor layer 22 is taken in by oxide film 25, and therefore the region covered by oxide film 25 does not reverse to P type.

Figure 4:
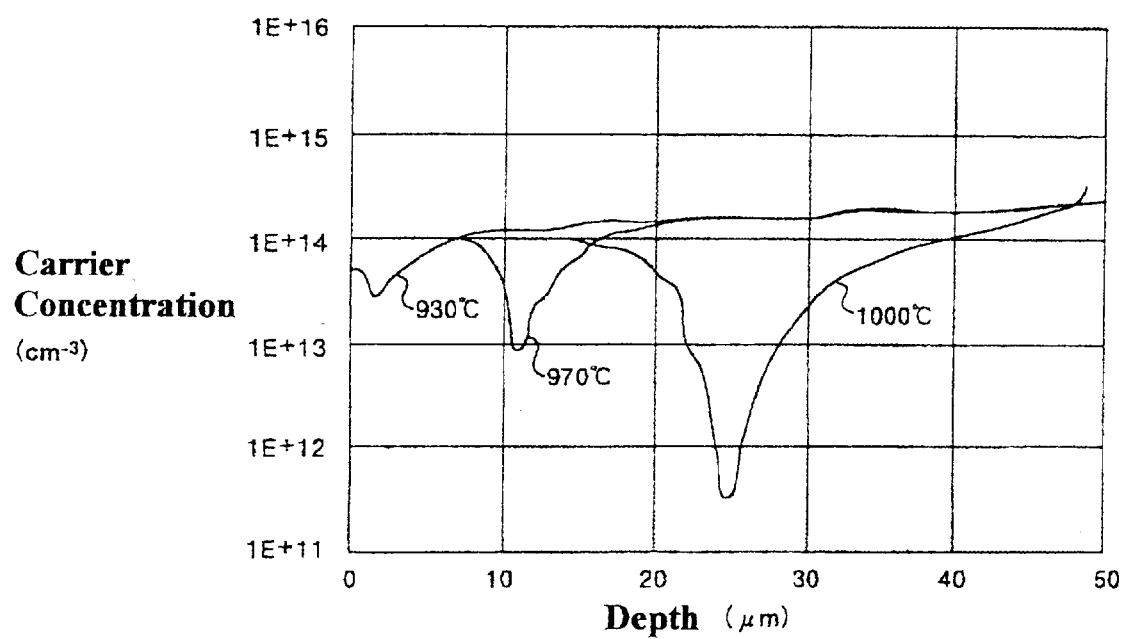
FIG. 4 is a character diagram showing the relationship between heat diffusion temperature of platinum and a carrier concentration distribution in a region near a surface.

Referring now to FIG. 4, we describe how the depth of pn-junction 29 is adjustable by controlling the heat diffusion conditions of platinum and the subsequent heat treatment conditions. The graph clearly shows the relationship between the heat diffusion temperature of platinum and the carrier concentration distribution near the surface region of a longitudinal cross-section passing through approximately the center of reverse region 23 (as indicated by the dashed line cross-section in FIG. 3). The valley of each profile corresponds to the depth of the pn junction.

As shown in FIG. 4, for a given heat diffusion time, at a diffusion temperature of 930 degrees C., the junction depth is approximately 1 micrometer; at 970 degrees C., the junction depth is approximately 10 micrometers, and at 1000 degrees C., junction depth is approximately 25 micrometers. As can be clearly seen, as the diffusion time increases, the profile of platinum becomes distributed towards the interior from the surface of the semiconductor (J. Appl. Phys. Vol.61, No. 3, 1055). Therefore, even at the same temperature, as the diffusion time becomes longer, the junction depth becomes deeper.

During formation of front electrode 26 and back electrode 27, in order to stabilize the contact resistance of the electrodes, heat treatment is conducted, for example, for 1 hour at 500 degrees C. However, the depth of pn junction 29 changes with this heat treatment as well.

Figure 5:
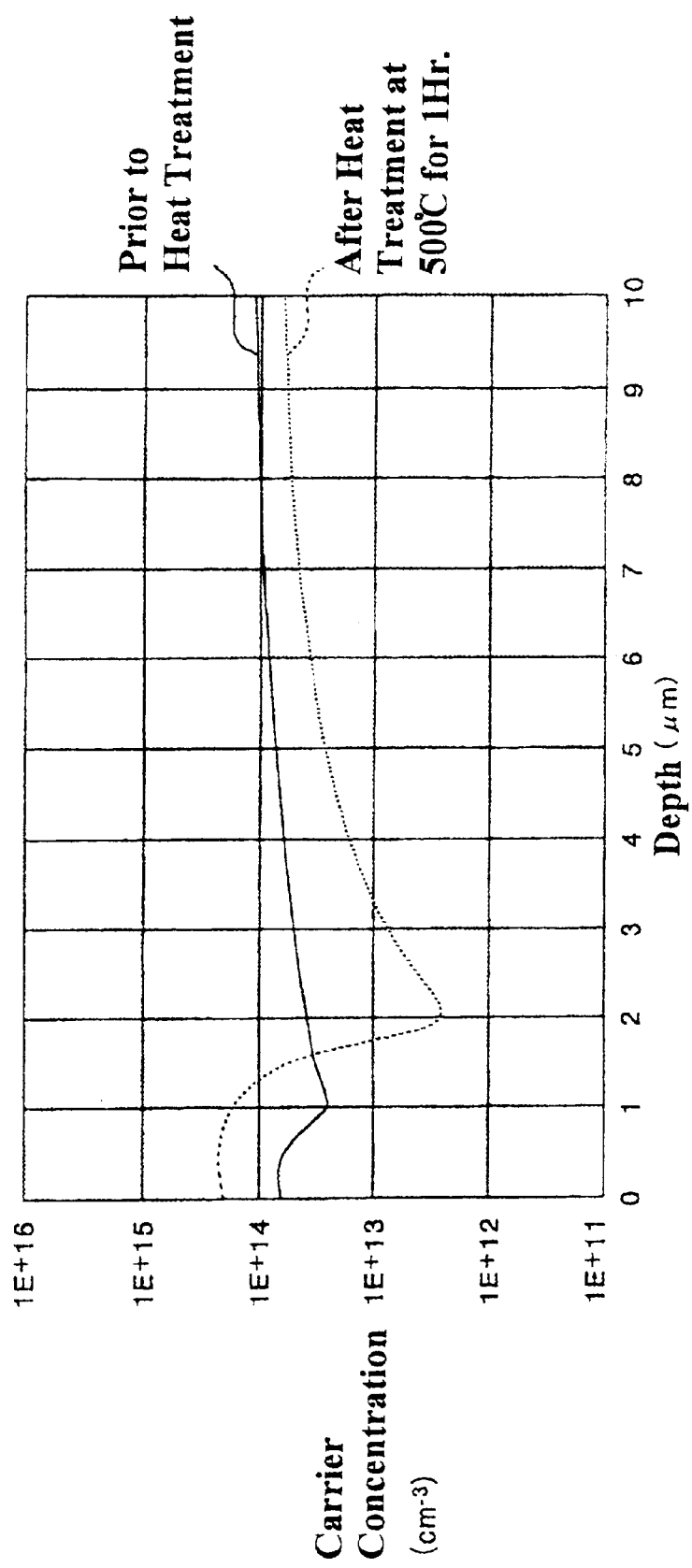
FIG. 5 is a character diagram showing changes in the carrier concentration distribution before and after conducting heat treatment after the heat diffusion of platinum.
Figure 6:
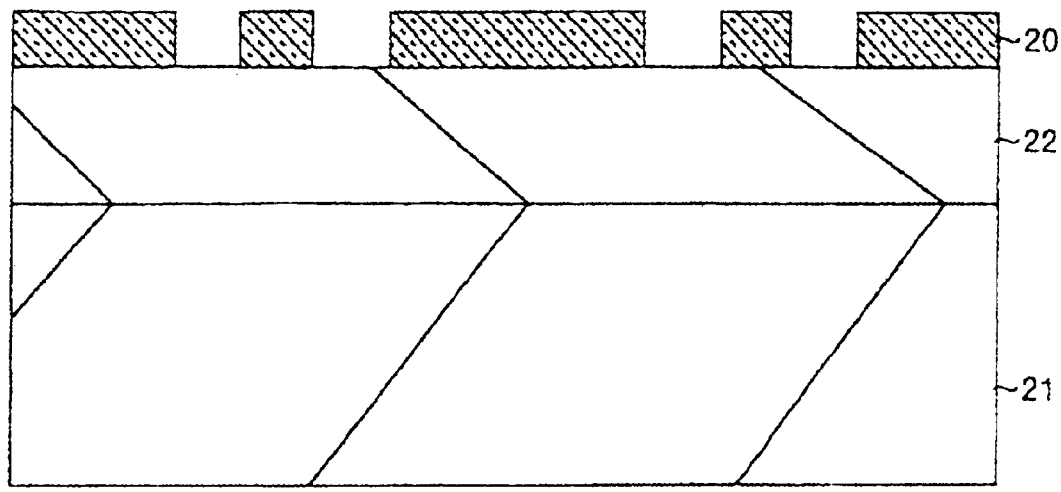
FIG. 6 is a longitudinal cross-section diagram showing the initial steps in the course of manufacturing the semiconductor device shown in FIG. 1.

Referring now to FIG. 5, where platinum is heat diffused in a semiconductor device at 930 degrees C., changes in the carrier concentration distribution before and after heat treatment (at 500 degrees C. for one hour) are clearly shown. The junction depth prior to heat treatment is 1 micrometer, but after heat treatment, the junction depth is 2 micrometers. In this manner, the junction depth of N-type semiconductor layer 22 and P-type reverse region 23 is controllable by the platinum heat diffusion conditions and subsequent heat treatment conditions.

Referring now to FIGS. 6 to 9, the manufacturing steps in the method of the present invention is described. First, semiconductor layer 22 is grown by epixtaxial growth on top of semiconductor substrate 21. A heat oxide film 20 of a thickness of 900 nm,(for example), is then formed on top of the surface of semiconductor layer 22. Etching with a photolithography technique, removes the oxide film in (for example) ring shapes, from the sections corresponding to the formation regions for active region edge 28 and guard ring region 24.

Figure 7:
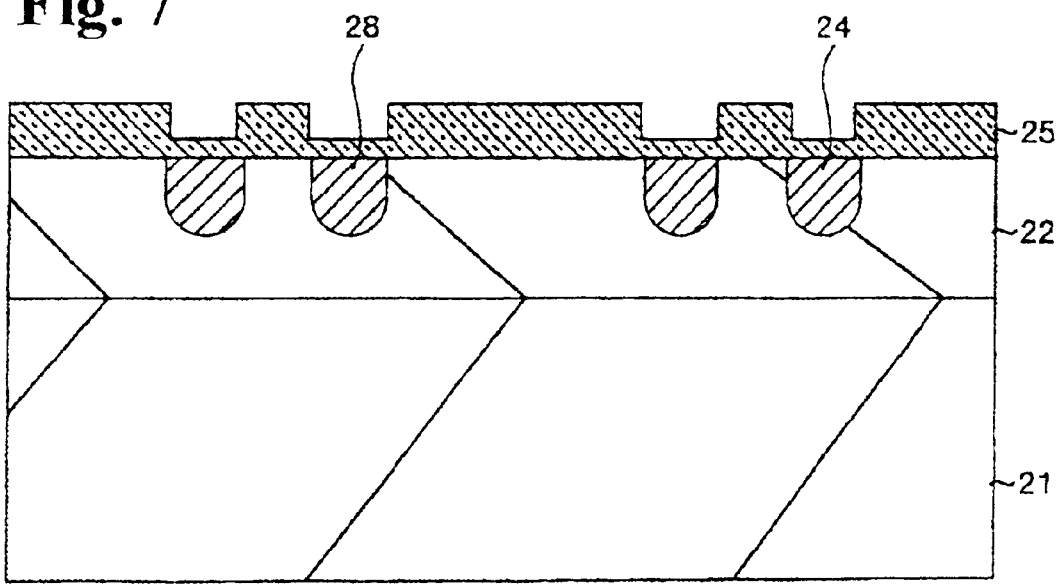
FIG. 7 is a longitudinal cross-section diagram showing further steps in the course of manufacturing the semiconductor device shown in FIG. 1.
Figure 8:
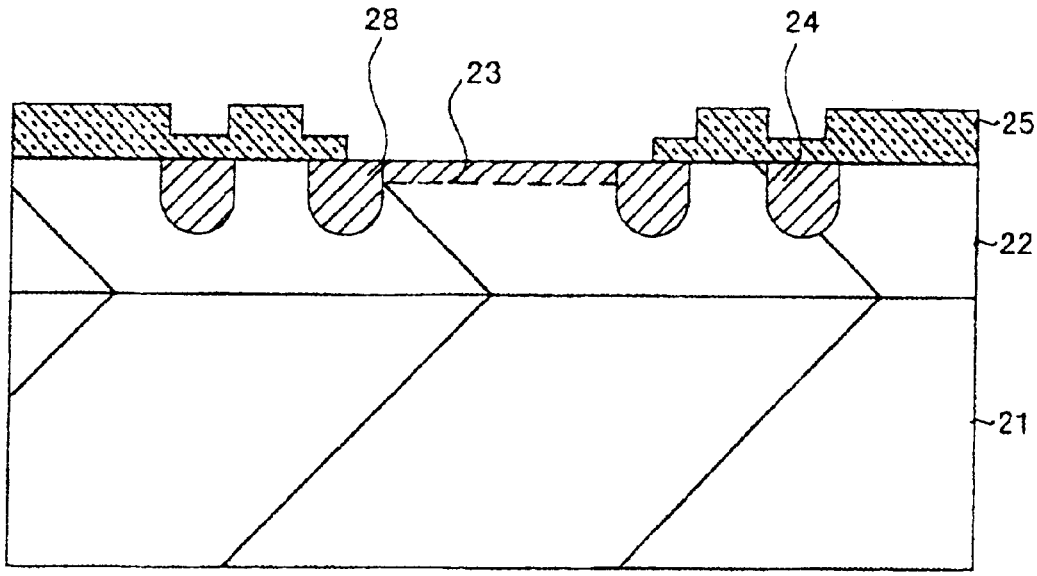
FIG. 8 is a longitudinal cross-section diagram showing still further steps in the course of manufacturing the semiconductor device shown in FIG. 1.
Figure 9:
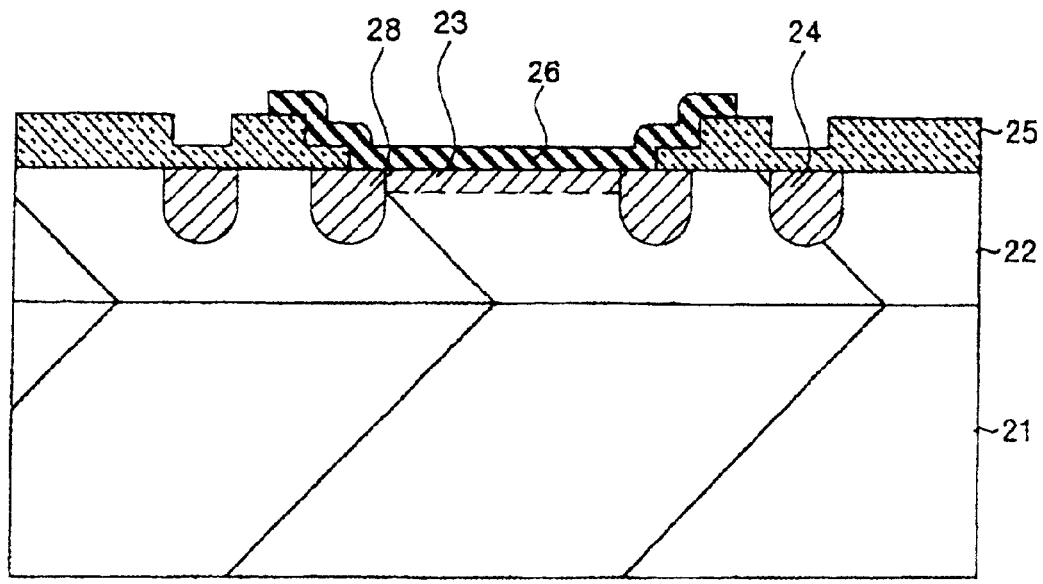
FIG. 9 is a longitudinal cross-section diagram showing the final step in the course of manufacturing the semiconductor device shown in FIG. 1.

Thereafter, with the remaining part of oxide film 20 used as a mask, boron (B) is ion injected into semiconductor layer 22. The dosage amount is $1\times10^{14}$ cm$^{-2}$, and the acceleration voltage is 50 kV. Afterwards, heat treatment is conducted for 7 hours at 1200 degrees C., and active region edge 28 and guard ring region 24 are formed. Formed simultaneously, oxide film 25 (of thickness of 400 nm for example) covers the entire surface of the wafer. The situation up to this point is shown in FIG. 7.

Next, using photolithography techniques and etching, oxide film 25 is removed from the area selected to form the active region. In this condition, the back surface of semiconductor substrate 21, or the semiconductor surface of the region forming the active region, is coated by a paste containing 1 weight % of platinum. Heat treatment is then conducted for 3 hours at 920 degrees C. In doing so, the area near the surface of the active region of semiconductor layer 22 reverses to a P-type, and reverse region 23 forms.

Next, AlSi of about 3 micrometers in thickness (for example) is layered on the wafer surface by spattering. By a photolithography technique and etching, the AlSi layer is patterned into a preselected and desired shape. Afterwards, heat treatment is conducted for 1 hour at 500 degrees C. in a $N_2$ atmosphere. These steps form front electrode 26 with a low resistance and which contacts reverse region 23 and active region edge 28. Alternatively, front electrode 26 may be formed by vacuum deposition of pure Al.

Finally, Ti, Ni, and Au are layered onto the back surface of semiconductor substrate 21 by vacuum deposition, and form back electrode 27. In the present example, the thickness of Ti is 0.7 micrometers, the thickness of Ni is 0.3 micrometers, and the thickness of Au is 0.1 micrometers.

Figure 21:
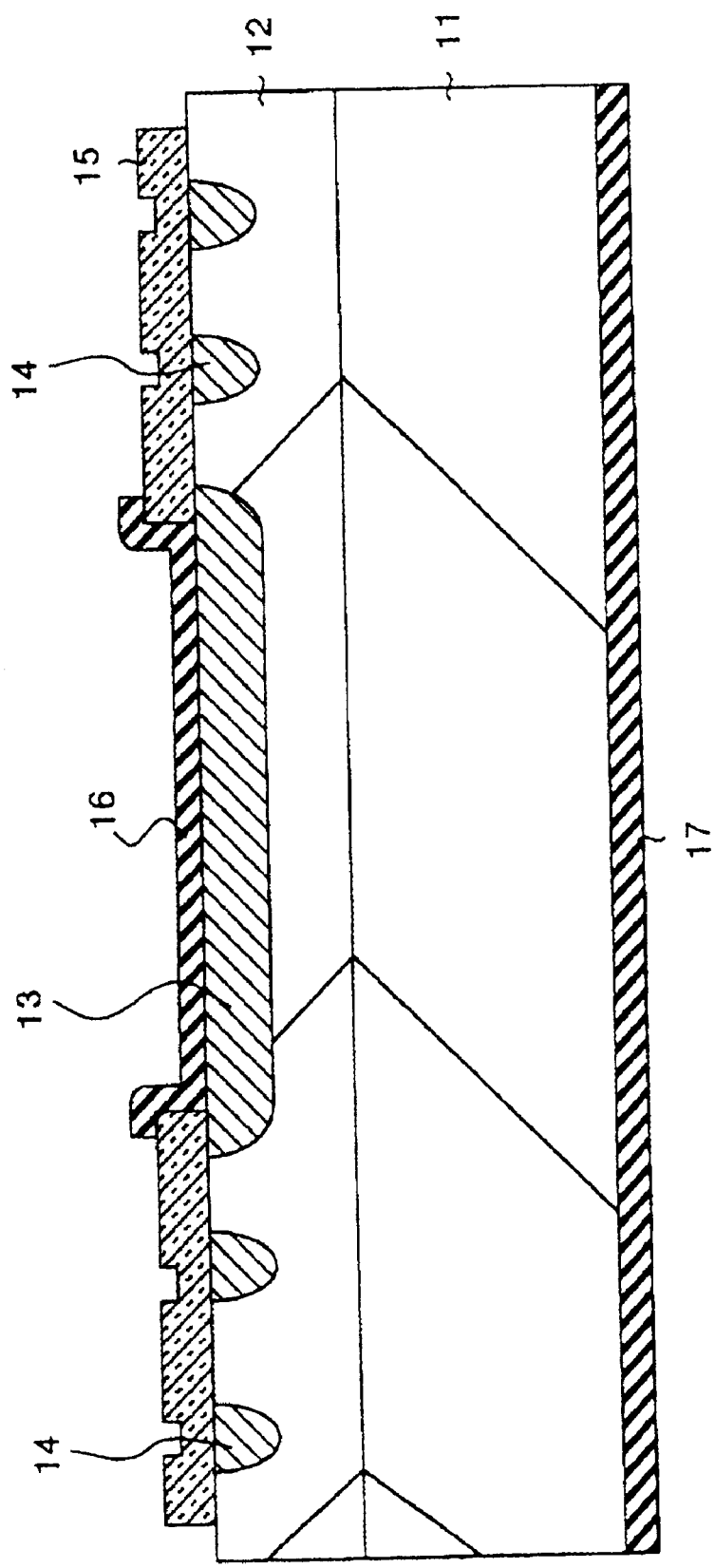
FIG. 21 is a longitudinal cross-section diagram of a semiconductor device according to the related art.

Next, described are the measurement results of the reverse recovery characteristics with the semiconductor device of the present embodiment (FIG. 1) and the semiconductor device of the related art construction (shown in FIG. 21).

Figure 10:
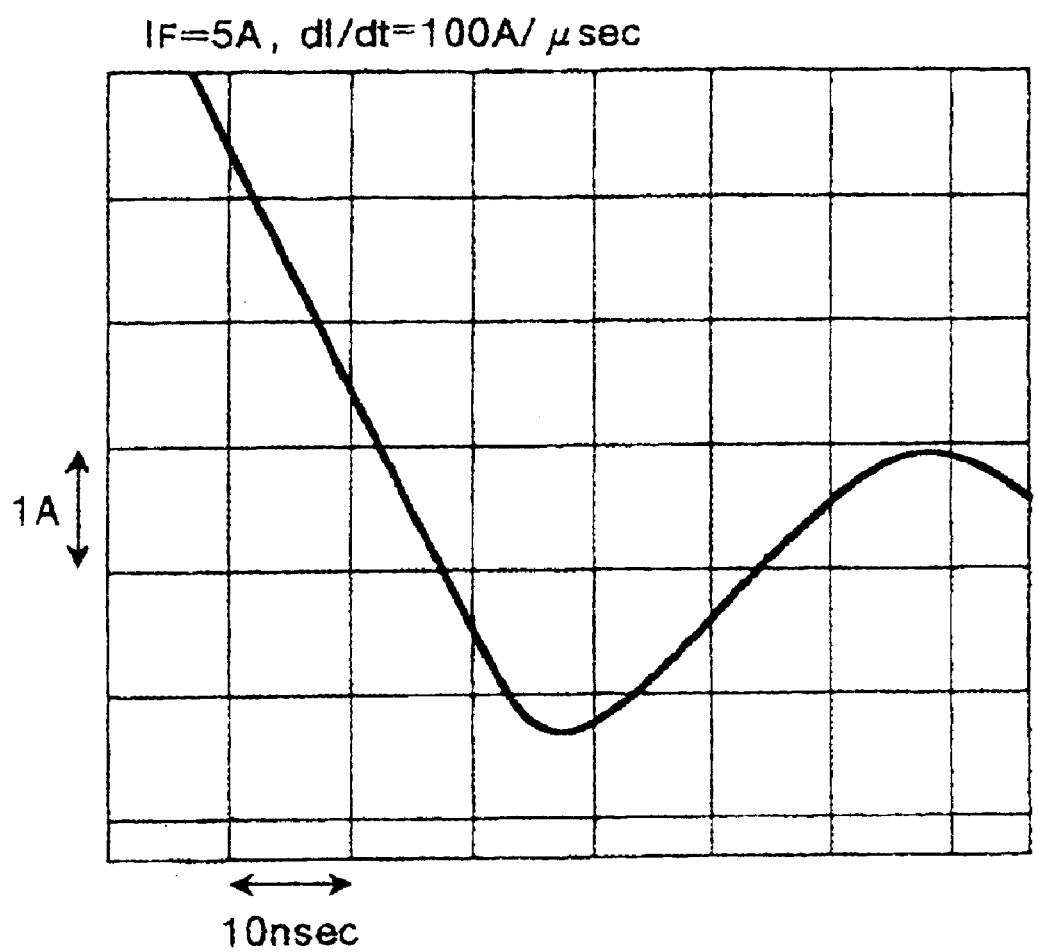
FIG. 10 is a waveform diagram showing the reverse recovery current of the semiconductor device shown in FIG. 1.

Referring now to FIG. 10, a waveform diagram shows the reverse recovery current of the semiconductor device of the present embodiment.

Figure 11:
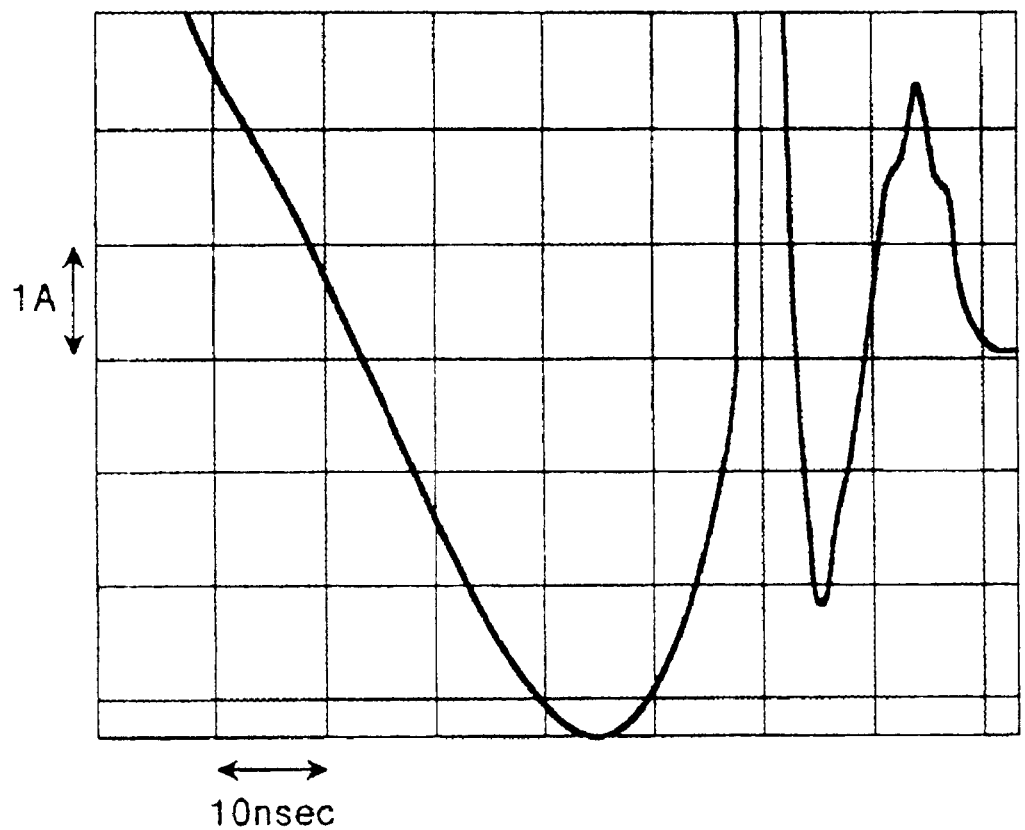
FIG. 11 is a waveform diagram showing the reverse recovery current of a semiconductor device of the related art.

Referring additionally now to FIG. 11, a waveform diagram shows the reverse recovery current of the semiconductor device of the prior art.

As can be seen, with the semiconductor device of the present embodiment, the peak value for the reverse recovery current is approximately 2.3 A. In contrast, the peak value for the reverse recovery current of the semiconductor device of the related art is approximately 4.6 A. Therefore, the peak value for the reverse recovery current of the present embodiment is approximately 50% of that of the related art, and it can be seen that there has been a large beneficial reduction in revers recovery current. As a further benefit, the attrition of the reverse recovery current, after the peak, is greatly softened compared to the waveform of the related art.

Figure 12:
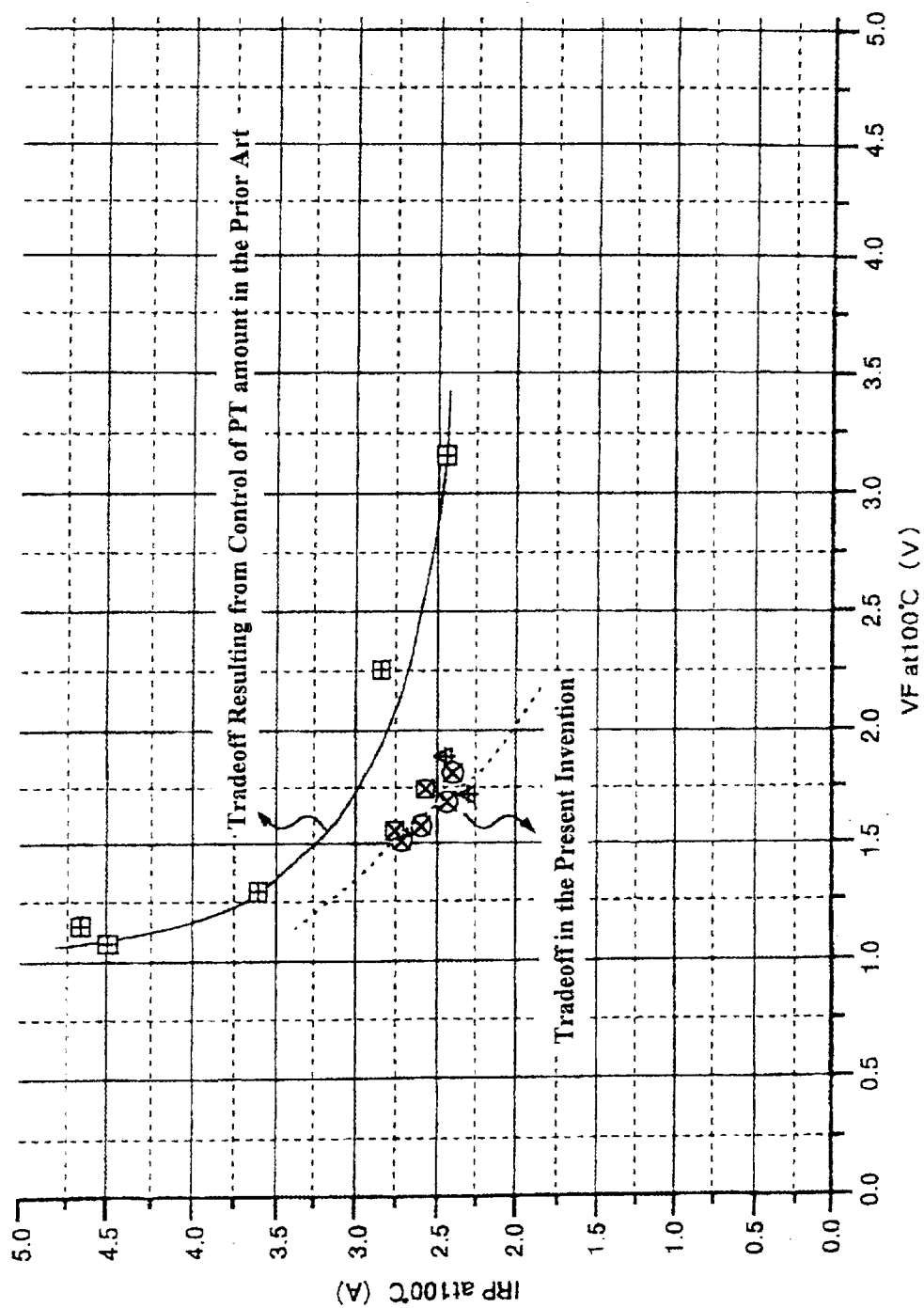
FIG. 12 is a descriptive diagram showing the VF and IRP tradeoff improvement (compared to the related art) of the semiconductor device of embodiment 1 of the present invention.

Referring now to FIG. 12, the results of a forward voltage VF and a reverse recovery current peak value IRP are shown. In the related art, the 'trade off' resulting from Pt diffusion condition adjustments are all hard recovery. In order to have softening, the VF is increased, or in other words, this 'trade off' results in a shift to the right in the graph. Therefore, compared to the tradeoff resulting from the Pt diffusion condition adjustments in the related art, the results of the first embodiment of the present invention show that a substantial improvement in 'tradeoff' is achieved.

According to the present invention, by heat diffusion of platinum in N-type semiconductor device 22, the region near the surface of semiconductor layer 22 reverses to a P-type. Since a shallow pn junction is formed by P-type reverse region 23 and N-type semiconductor layer 22, the platinum concentration does not need to be any higher than necessary, and the pn junction is formed at a position where the effects of platinum can be seen. As a result of this design and manufacturing method, a semiconductor device for constructing a diode is easily achieved which is fast and also has adequate soft recovery properties.

In addition, because the active region is formed in a shallow area, the tradeoff relationship between the forward voltage and reverse recovery current of the diode is improved. Consequently, because the pn junction does not need to be created by forming a P-type semiconductor region by injecting a P-type impurity into a N-type semiconductor layer 22 (as in the related art), the manufacturing process is simplified.

In the first embodiment, described above, electrode 26 and electrode 27 are formed following heat diffusion of platinum, but the present invention is not limited to this specific design. For example, after heat diffusion of platinum, and before forming electrodes 26, 27, the back surface of semiconductor substrate 1 can be polished so that the semiconductor device has an overall thickness of around 300 micrometers. By doing so, the heat radiating property is beneficially improved.

As described above, the active region is constructed from reverse region 23 and active region edge 28, but the present invention is not limited to this specific design.

Figure 13:
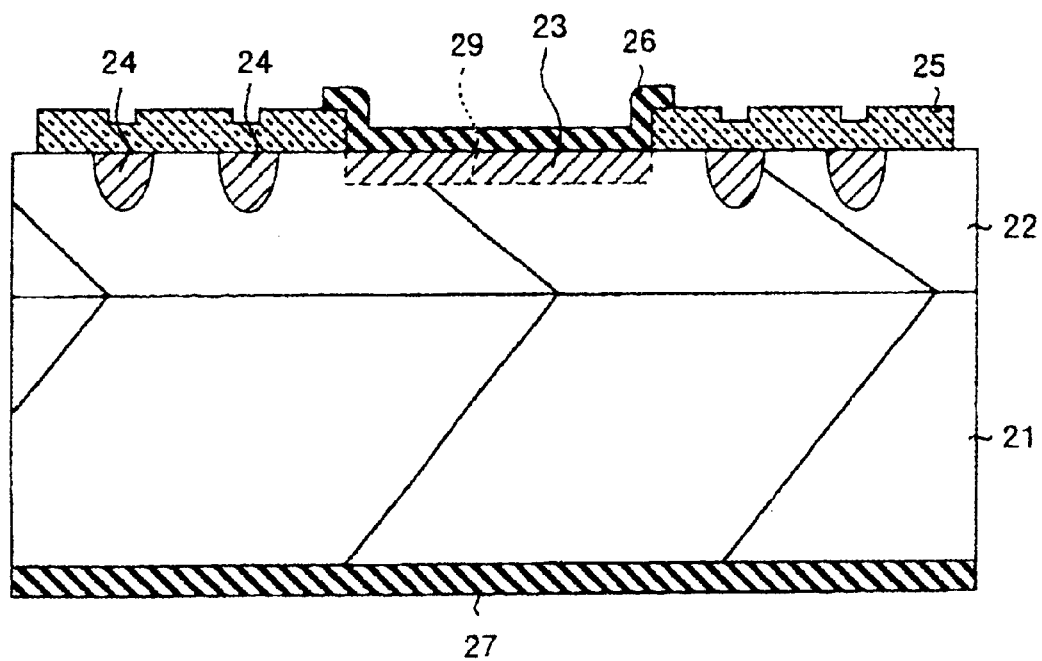
FIG. 13 is a longitudinal cross-section diagram of another example of a semiconductor device of embodiment 1 of the present invention.

Referring now to FIG. 13, if a high voltage resistance is not required, the active region can be constructed from reverse region 23 alone, without active region edge 28. In this design, guard ring region 24 is provided as a double ring.

Second Embodiment

Figure 14:
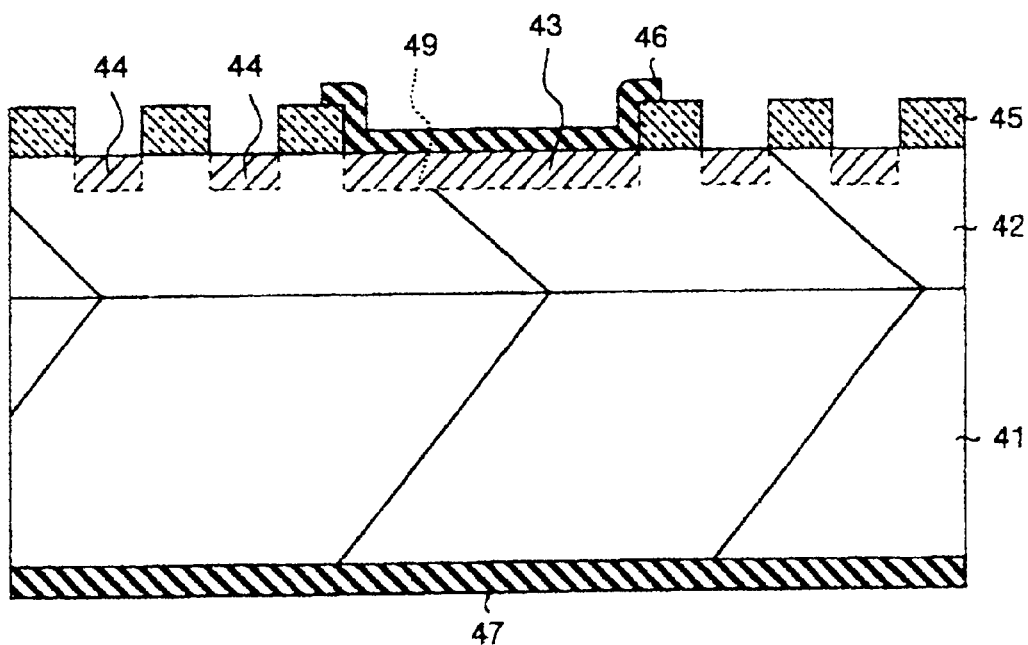
FIG. 14 is a longitudinal cross-section showing the structure of a semiconductor device of a second embodiment of the present invention.

Referring now to FIG. 14, the structure of a second embodiment of a semiconductor device is shown. The semiconductor device has a N-type semiconductor substrate 41 doped with As (arsenic), a N-type semiconductor layer 42 doped with P (phosphorus). Also included are a P-type reverse region 43, a P-type guard ring region 44, an oxide film 45, a front electrode 46 and a back electrode 47.

As an example, the thickness of semiconductor substrate 41 is 500 micrometers, and its impurity concentration is $2 \times 10^{19}$ cm$^{-3}$. Also as an example, the thickness of semiconductor layer 42 is 60 micrometers, and its impurity concentration is $2 \times 10^{14}$ cm$^{-3}$.

A portion of the surface of semiconductor layer 42 is covered by oxide film 45. Reverse region 43 is formed shallowly below a region on the surface of semiconductor layer 42 not covered by oxide film 45. The junction depth xj (xj:several micrometers) of reverse region 43 (the depth of a pn junction 49) is several micrometers.

Guard ring region 44 is formed in a region on the surface of semiconductor layer 42 surrounding reverse region 43. Guard ring region 44 is formed as a double ring-shape in the present embodiment, but is not limited to this design. Junction depth xj of guard ring region 44 is the same as for reverse region 43. Guard ring region 44 can be a single ring or three or more rings. Front electrode 46 is formed so that it contacts the surface of reverse region 43. Back electrode 47 is formed contacting the back surface of semiconductor substrate 41.

Reverse region 43 and guard ring region 44 are created by the high concentration of platinum 'piled up' near the surface region of semiconductor layer 42 and the resulting reversal of N-type semiconductor layer 42 to a P-type. Therefore, as with the first embodiment, the junction depths for reverse region 43 and guard ring region 44 are controlled by controlling the heat diffusion conditions and subsequent heat treatment conditions.

Figure 15:
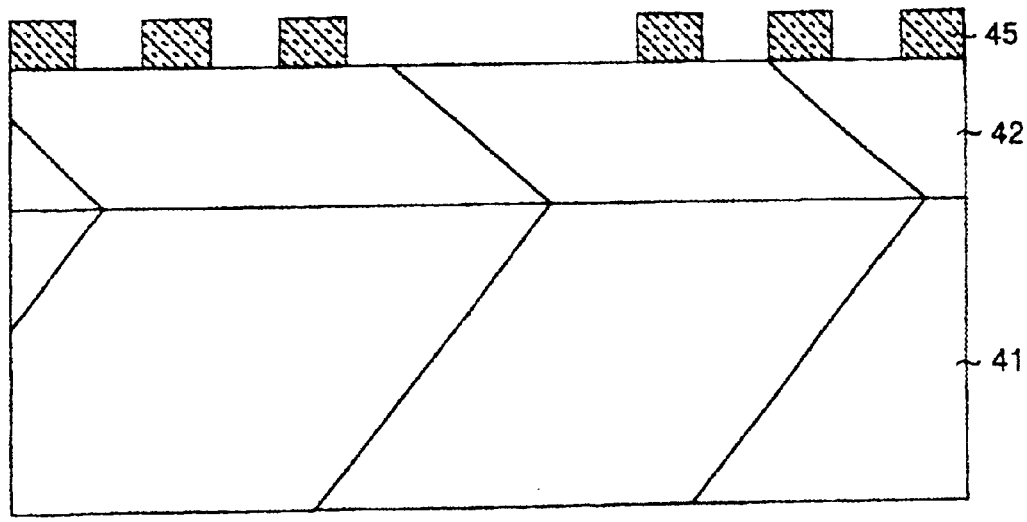
FIG. 15 is a longitudinal cross-section diagram showing the initial steps in the manufacture of the semiconductor device shown in FIG. 14.
Figure 16:
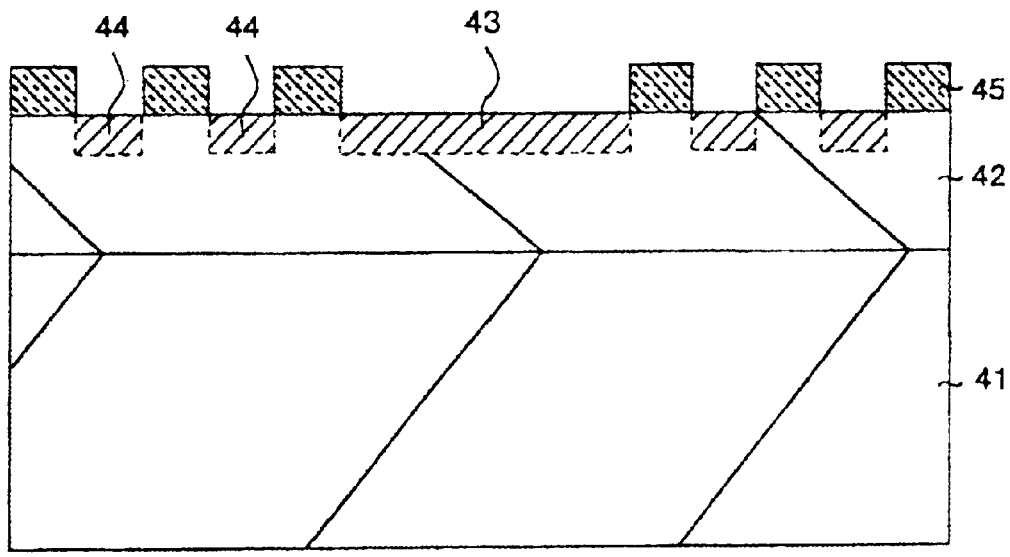
FIG. 16 is a longitudinal cross-section diagram showing the next steps in the manufacture of the semiconductor device shown in FIG. 14.
Figure 17:
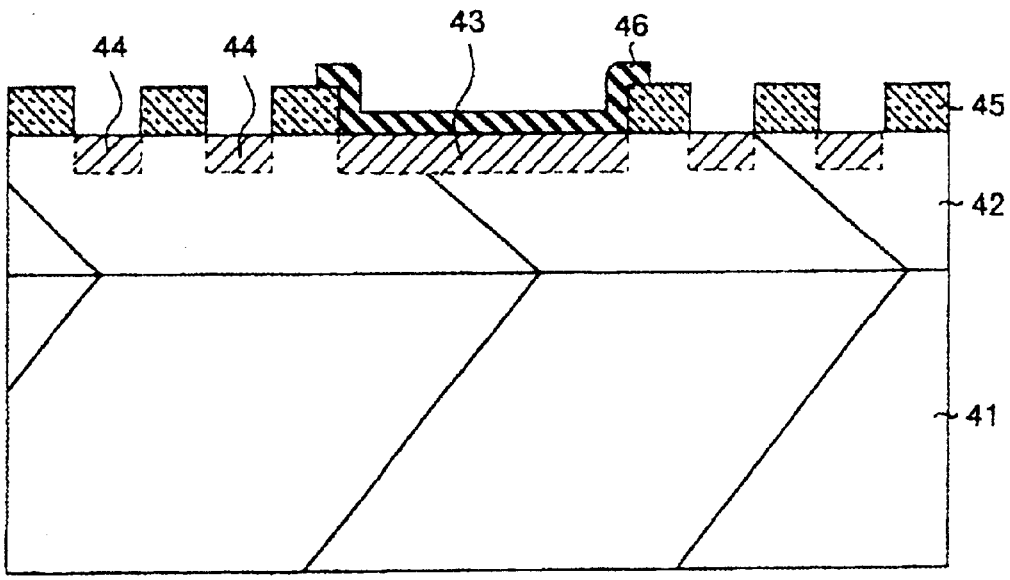
FIG. 17 is a longitudinal cross-section diagram showing further steps in the manufacture of the semiconductor device shown in FIG. 14.

Referring now to FIGS. 15 to 17, as with the first embodiment, the manufacturing method of the second embodiment includes a first step of forming semiconductor layer 42 and heat oxide film 45 with a thickness of 900 nm, (for example) sequentially on top of semiconductor substrate 41. By photolithography techniques and etching, a portion of oxide film 45 then removed, and the semiconductor surface in the region forming future reverse region 43 and guard ring region 44 is exposed.

Next, a paste containing 1 weight % of platinum is coated onto the back of semiconductor substrate 41, or onto the semiconductor surface that has been exposed by the removal of oxide film 45. Heat treatment next conducted for three hours at 920 degrees C. Through this heat treatment, the area near the exposed surface of semiconductor layer 42 reverses to a P-type, and reverse region 43 and guard ring region 44 are formed.

A front electrode 46 with a low resistance is then formed in contact with reverse region 43. Finally, a back electrode 47 is formed on the back surface of semiconductor substrate 41.

In the second embodiment, as with the first, a semiconductor device for constructing a diode that is fast and has adequate soft recovery characteristics is easily achieved. This process also provides a beneficial and simplified manufacturing process because the injection of P-type impurities is unnecessary.

As a further benefit, since guard ring region 44 is formed by the heat diffusion of platinum at the same time as reverse region 43, compared to the first embodiment, the manufacturing process is further simplified.

The second embodiment has a simple structure in which a single reverse region 43 constructs the active region. However, it should be understood, that the second embodiment is not limited solely to this structure.

Figure 18:
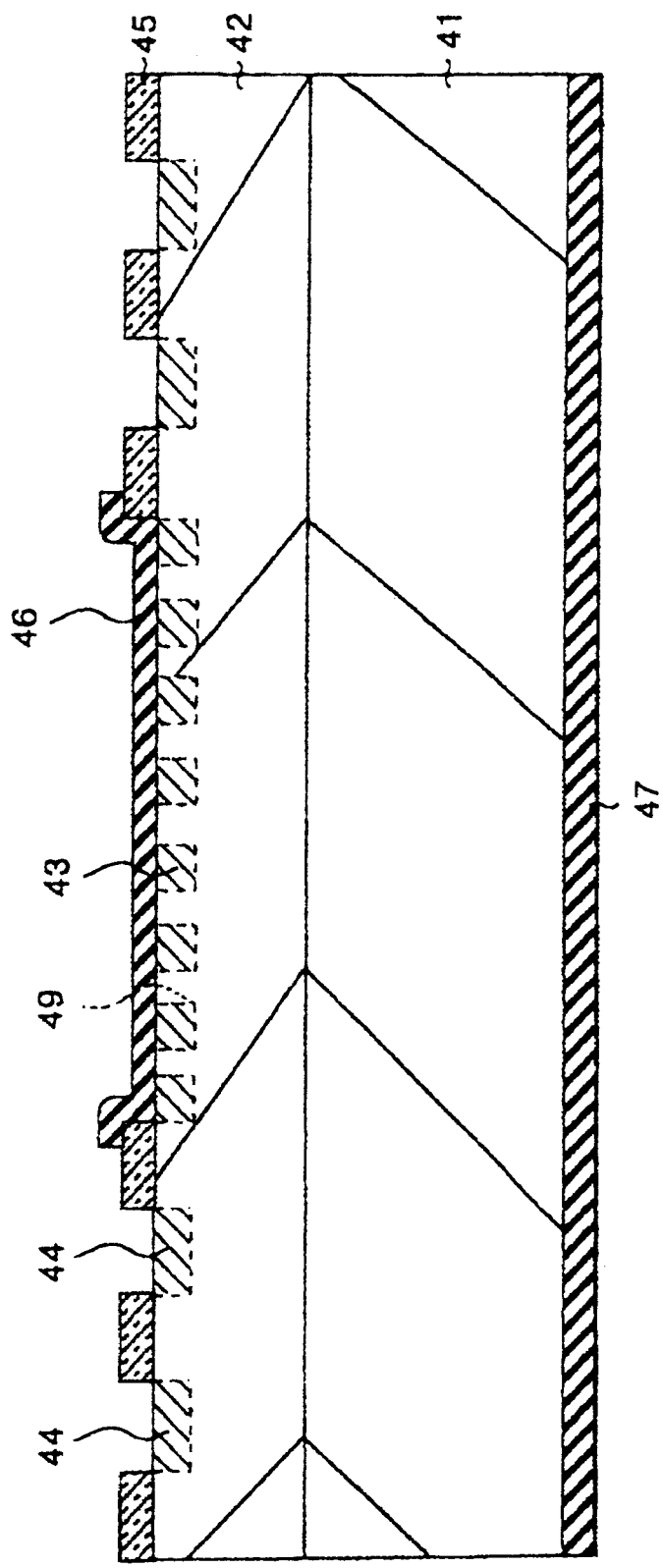
FIG. 18 is a longitudinal cross-section diagram of another example of a semiconductor device of the second embodiment of the present invention.

Referring now to FIG. 18, for example, reverse region 43 of a P-type is provided in a portion of the active region, and the rest of the active region remains a N-type. In this embodiment, the active region is constructed from a reverse region 43 that has any fine pattern, such as a ring-shape, stripe shape, or a dot shape. In this situation, during heat diffusion of platinum, an oxide film that has a complementary pattern as the above described fine pattern, is left on the region forming the active region. This structure can also be used in the semiconductor device of the first embodiment.

In the second embodiment, the wafer element is formed by the epitaxial growth of semiconductor layer 22 on top of semiconductor substrate 21. The design is not restricted solely to this arrangement.

Figure 19:
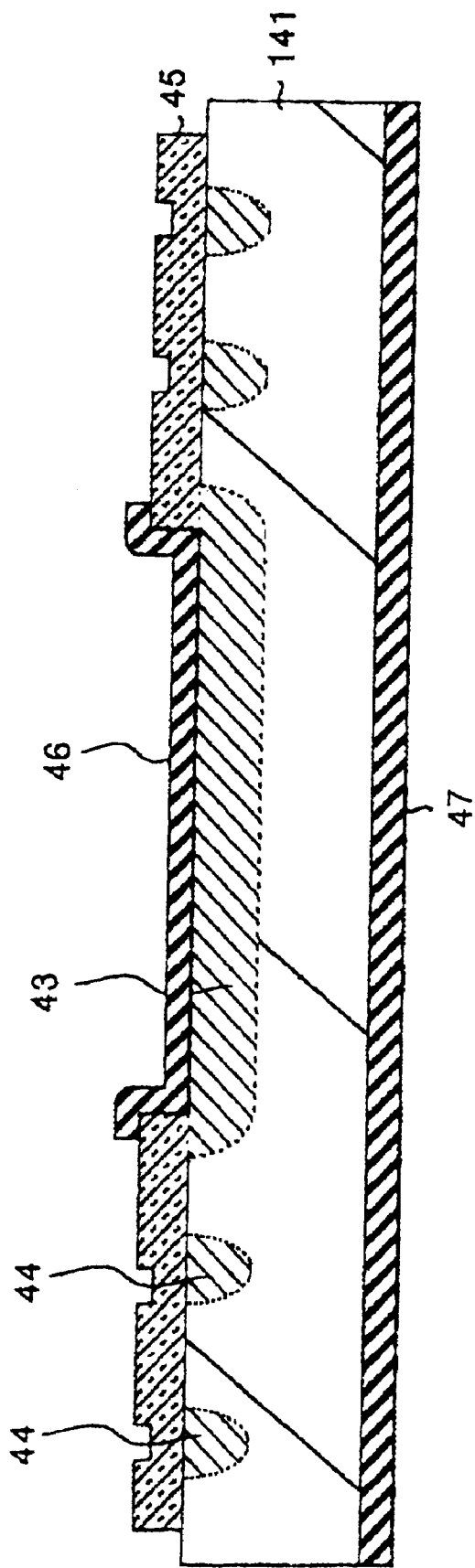
FIG. 19 is a longitudinal cross-section diagram of another example of a semiconductor device of the second embodiment of the present invention.

Referring now to FIG. 19, a new arrangement is possible because it is cheaper that wafers have epitaxial growth as described above, a FZ wafer with an impurity concentration of $2 \times 10^{14}$ cm$^{-3}$ and a thickness of about 500 micrometers (for example) is used as a semiconductor substrate 141. In this example, oxide film 45 of a thickness 800 nm (for example) is formed on the surface of the FZ wafer. After opening a portion of oxide film 45, mechanical polishing is conducted from the back side of semiconductor substrate 141 so that the thickness becomes, for example, 60 micrometers. Afterwards, platinum is heat diffused from the back surface of semiconductor substrate 141, and reverse region 43 and guard ring region 44 are formed.

Where necessary, in order to have the back surface of semiconductor 141 and back electrode 47 in contact at low resistance, a N-type dopant such as As is injected from the back surface of semiconductor substrate 141 with a surface concentration of about $1 \times 10^{18}$ cm$^{-3}$. After this treatment, front electrode 46 and back electrode 47 are formed. The resulting structure may be alternatively used for the semiconductor device of the first embodiment.

Third Embodiment

Figure 20:
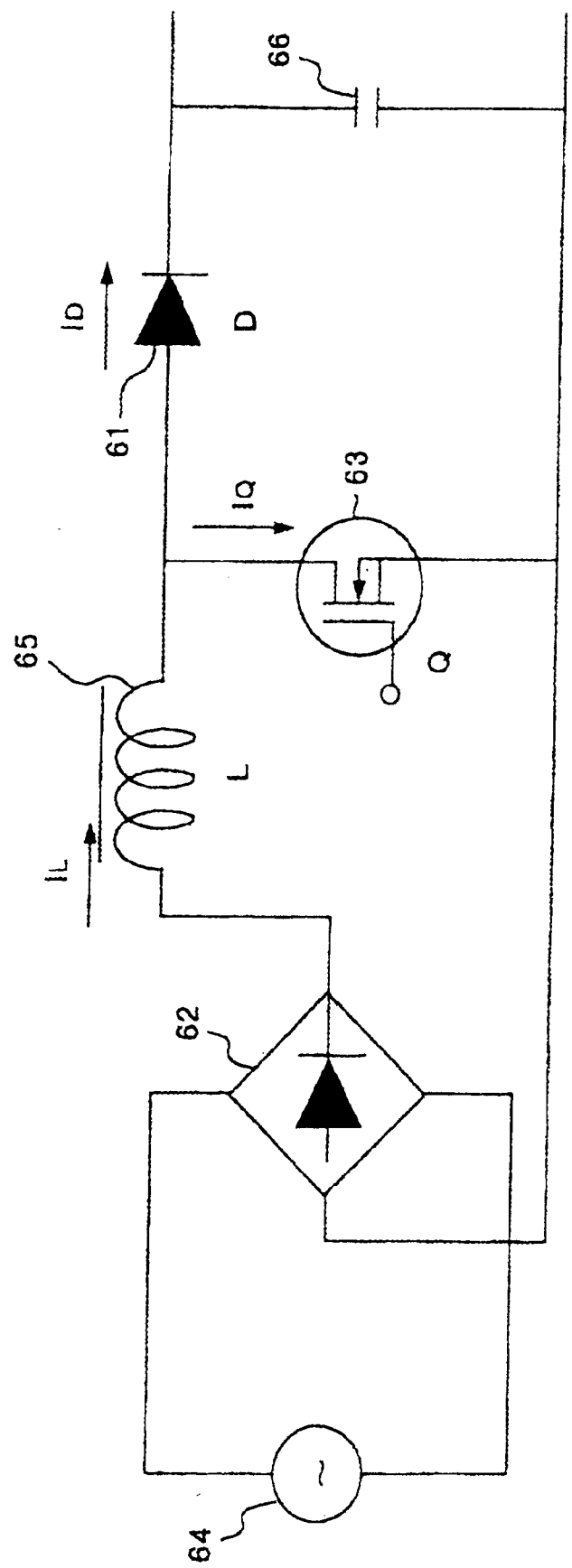
FIG. 20 is a circuit diagram showing an example of a power factor improvement circuit (PFC) using a semiconductor device of the present invention.

Referring now to FIG. 20, a circuit diagram of an example of a power factor improvement circuit (PFC) that employs the semiconductor device of the present invention as a diode 61. Diode 61 may be constructed with either the first or second above-described embodiment. The PFC also includes a diode bridge 62, and alternating current input 64, an inductance 65, a capacitor 66, and a MOS transistor 63 as a switching element.

In this PFC embodiment, when transistor 63 is turned off from the on state (because of the release of energy stored in inductance 65), diode 61 becomes conductive. The now-conducting diode 61 becomes reverse biased when transistor 63 is switched on from the off state. When this occurs, diode 61 is conductive until the charge stored in diode 61 is gone. During this reverse recovery period, in addition to the current flowing to the negative charge, a reverse recovery current flows to diode 61. As a result, although there is a large current flow in the initial turn on period of transistor 63, because the reverse recovery current of diode 61 is greatly reduced compared to the prior art, the current flowing during the initial turn on period of transistor 63 is smaller than in the prior art. This provides an important benefit.

Furthermore, due to changes with time, when the reverse recovery current is decreasing and the floating inductance of the circuit, voltage noise is generated. This undesirable voltage noise is added onto the power source voltage and is applied to transistor 63 and diode 61. As described above, because the attrition rate after the peak of the reverse recovery current is greatly reduced (compared to that of the prior art) the generated voltage noise is also very small. Therefore, according to the third embodiment, the breakdown of the semiconductor element constructing the power factor improvement circuit (PFC) and errors in the circuit are prevented.

In the present invention described above, multiple changes are possible within the scope of the present invention. For example, since platinum functions as a donor in a P-type silicon semiconductor, the first conductive type can be a P-type and the second conductive type can be a N-type. In that situation, a N-type reverse region is formed near the surface of a P-type semiconductor layer.

Furthermore, as noted in the above embodiments, heat diffusion of platinum from the surface is used as a method for doping platinum at a higher concentration near the surface of a semiconductor region than at the interior. However, the present invention is not limited to nonequivalent concentration. For example, a method of ion injecting platinum or doping treatment during silicon crystal formation may also be used.

According to the present invention, because a pn junction is formed by a reverse region of a second conductive type that is created by heat diffusion of platinum and a semiconductor region of a first conductive type, the pn junction is much more shallow compared to the prior art. The position of the pn junction coincides with the position where platinum is generally effective. Therefore, a semiconductor device for constructing a diode that is fast and has adequate soft recovery characteristics is easily achieved at relatively low costs.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A diode comprising:

a semiconductor region of a first conductive type;

a platinum doped region of a first surface of said semiconductor region;

said platinum doped region being a reverse region of a second conductive type;

said platinum doping in said reverse region being at a higher concentration near said first surface of said semiconductor region than in an interior portion of said semiconductor region; and said semiconductor region and said reverse region forming a pn junction.

2. A diode according to claim 1, wherein:

at least a first portion of said first surface of said semiconductor region being covered by at least an oxide film; and said reverse region being formed in a first region corresponding to an open window of said oxide film.

3. A diode according to claim 2, further comprising:

a first electrode electrically contacting said reverse region;

a second electrode electrically contacting said semiconductor region;

at least one impurity diffusion region of said second conductive type surrounding said reverse region; and said at least one impurity diffusion region joining said semiconductor region at a position deeper than said pn junction.

4. A diode according to claim 3, further comprising:

a plurality of impurity diffusion regions; and an innermost impurity diffusion region, of said plurality of impurity diffusion regions, connecting to said reverse region and said first electrode.

5. A diode according to claim 4, wherein:

said first electrode additionally electrically contacts said semiconductor region.

6. A diode according to claim 3, wherein:

said first electrode additionally electrically contacts said semiconductor region.

7. A diode according to claim 2, further comprising:

a first electrode electrically contacting said reverse region;

a second electrode electrically contacting said semiconductor region; and a second reverse region surrounding said reverse region and being reversed to said second conductive type by platinum doping at a higher concentration near said first surface of said semiconductor region than said interior.

8. A diode according to claim 7, wherein:

said first electrode additionally electrically contacts said semiconductor region.

9. A diode according to claim 1, wherein:

said semiconductor region is a silicon semiconductor.

* * * * *